United States Patent
Dunlop et al.

(10) Patent No.: US 7,010,077 B1
(45) Date of Patent: Mar. 7, 2006

(54) GATED CLOCK RECOVERY CIRCUIT

(75) Inventors: Alfred Earl Dunlop, New Providence, NJ (US); Wilhelm Carl Fischer, Westfield, NJ (US)

(73) Assignee: Agere Systems Inc., Allentown, PA (US)

( * ) Notice: Subject to any disclaimer, the term of this patent is extended or adjusted under 35 U.S.C. 154(b) by 562 days.

(21) Appl. No.: 09/716,977

(22) Filed: Nov. 20, 2000

(51) Int. Cl.
H03D 3/24 (2006.01)

(52) U.S. Cl. .................... 375/376; 375/373; 375/375; 331/2; 331/1 A

(58) Field of Classification Search ............... 375/376, 375/373, 375; 331/1 A, 2
See application file for complete search history.

(56) References Cited

U.S. PATENT DOCUMENTS

| | | | | |
|---|---|---|---|---|
| 5,072,195 | A * | 12/1991 | Graham et al. ............... 331/2 |
| 5,237,290 | A | 8/1993 | Banu et al. ................... 331/2 |
| 5,463,351 | A * | 10/1995 | Marko et al. ............... 331/1 A |
| 5,483,180 | A | 1/1996 | Chai et al. ................... 326/93 |
| 5,610,558 | A * | 3/1997 | Mittel et al. ................. 331/2 |
| 5,675,620 | A * | 10/1997 | Chen .......................... 375/376 |
| 5,757,872 | A | 5/1998 | Banu et al. .................. 375/372 |
| 5,952,892 | A | 9/1999 | Szajda ......................... 331/57 |
| 5,982,836 | A | 11/1999 | Sakae et al. ................. 375/376 |
| 6,215,835 | B1 * | 4/2001 | Kyles ........................... 375/376 |

FOREIGN PATENT DOCUMENTS

| | | |
|---|---|---|
| EP | 0 530 775 A2 | 9/1992 |
| EP | 0 715 427 A1 | 11/1995 |

* cited by examiner

*Primary Examiner*—Shuwang Liu
*Assistant Examiner*—Eva Zheng

(57) ABSTRACT

A gated clock recovery circuit is disclosed that receives an input data stream and generates a frequency and phase aligned clock output. The gated clock recovery circuit substantially instantaneously adjusts the generated clock signal to phase changes in the incoming data stream. In addition, the gated clock recovery circuit generates the clock output signal using only transmitted non-predetermined data. The gated clock recovery circuit includes two PLL circuits. The first PLL (PLL1) adjusts to the frequency of the transmitter, and provides a bias voltage, CAP1, to the second PLL (PLL2) to indirectly initially tune the second PLL. The bias voltage, CAP1, is applied to the second PLL through a transmission gate (or switch) that is initially in a closed (short) position. Thus, the first PLL drives the bias voltage, CAP2, of the second PLL, to align the frequency with the transmitter, until received data opens the transmission gate. Thereafter, the bias voltage, CAP2, is removed and the second PLL can operate without being controlled by PLL1 so that the second PLL oscillates in phase with the received data. Simultaneously, the received data starts the oscillator in the second PLL so that the second oscillator is in phase with the received data. The second PLL then maintains this phase relationship between the second oscillator and the received data.

36 Claims, 2 Drawing Sheets

GATED CLOCK RECOVERY CIRCUIT

FIELD OF THE INVENTION

The present invention relates to clock recovery circuits, and more particularly, to circuits that operate in a burst mode to recover the clock signal from an early bit in the incoming data.

BACKGROUND OF THE INVENTION

In a communication system, the transmitter has clock circuitry that controls the speed at which data is transferred via a communications medium. The receiver also has clock circuitry that controls the speed at which the data that is received from the communications medium is processed. Ideally, the receiver's clock and the transmitter's clock will operate at exactly the same frequency and will be appropriately aligned in phase. The transmitter's clock and the receiver's clock, however, are typically close but not identical in frequency, resulting in frequency mismatch.

Receivers in many digital communication systems recover the clock signal directly from the incoming data sequence, typically using a phase-locked loop (PLL) circuit. In such an implementation, the PLL circuits generate a local clock signal that is phase aligned with the incoming reference signal. The phase aligned local clock signal facilitates the receipt and processing of synchronous data sent by a transmitter in the communication system.

Typically, conventional PLL circuits include a phase detector, a filter and a voltage-controlled oscillator (VCO). In the conventional PLL circuit, the phase detector compares the incoming reference signal (DATA) and the output of the VCO. The phase detector generates an error signal that is representative of the phase difference of the reference signal and the VCO output. The error signal is filtered and applied to the control input of the VCO to produce an output signal that tracks the phase of the reference signal.

Many clock recovery circuits operate in a continuous mode, where the transmitter and receiver continuously operate and monitor communication ports for arriving data. Such continuous operation, however, requires a significant amount of power, which is particularly problematic for battery-powered receivers, such as those deployed in wireless or optical communication systems. Thus, it is desirable to conserve power in such receivers by operating only when there is data to be processed. Thus, a number of clock recovery circuits have been proposed or suggested that operate in a burst mode to quickly adjust to phase changes in data coming from the communications medium. See, for example, U.S. Pat. No. 5,757,872, entitled "Clock Recovery Circuit," assigned to the assignee of the present invention, and incorporated by reference herein.

In addition to providing improved power consumption characteristics, such burst mode clock recovery circuits also do not require a long string of binary transitions to generate a clock signal that has the same frequency and appropriate phase alignment with the incoming data. While such burst mode clock recovery circuits exhibit improved performance relative to continuous mode clock recovery circuits, they suffer from a number of limitations, which, if overcome, could expand the utility and efficiency of burst mode clock recovery circuits. For example, most burst mode clock recovery circuits exhibit mismatch between the oscillators, thereby causing a frequency offset. A need therefore exists for a method and apparatus for recovering a clock signal from an incoming reference signal that has matched oscillators without a frequency offset.

SUMMARY OF THE INVENTION

A gated clock recovery circuit is disclosed that receives an input data stream and generates a frequency and phase aligned clock output. The gated clock recovery circuit substantially instantaneously adjusts the generated clock output to phase changes in the incoming data stream. In addition, the gated clock recovery circuit generates the clock output signal using only transmitted non-predetermined data. In other words, the gated clock recovery circuit of the present invention can generate a clock signal having a frequency and phase that are substantially aligned with the clock of the transmitter, without requiring any specific transition pattern or consecutive string of binary "1s" or "0s."

According to one aspect of the invention, the gated clock recovery circuit includes two PLL circuits. The first PLL (PLL1) initially adjusts to the frequency of a local clock reference and indirectly tunes the second PLL (PLL2). In this manner, the second PLL immediately adjusts to the phase of the received data, once such incoming data is received and maintains this phase relationship between the second oscillator and the received data.

DETAILED DESCRIPTION

Figure 1:
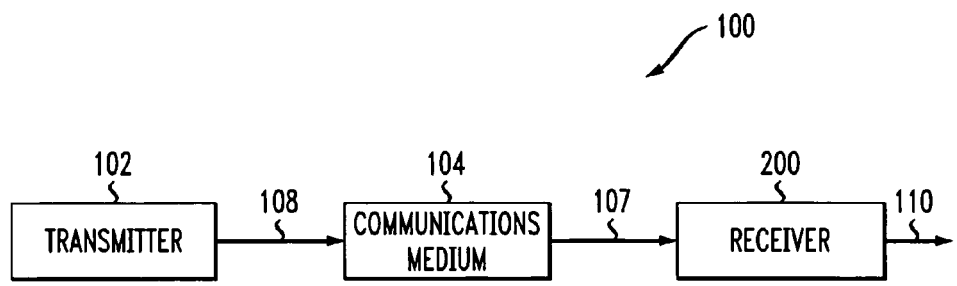
FIG. 1 is a schematic block diagram illustrating a communication system in which the present invention may be used.

FIG. 1 illustrates a communication system 100 in accordance with the present invention. As shown in FIG. 1, the communication system 100 is comprised of a transmitter 102, a communications medium 104, and a receiver 200, discussed further below in conjunction with FIG. 2, connected as shown. Data 108 is output by the transmitter 102, carried by the communications medium 104, and arrives at the receiver 200 as an input data stream 107. The receiver 200 decodes the data signal to produce an output data stream 110.

Figure 2:
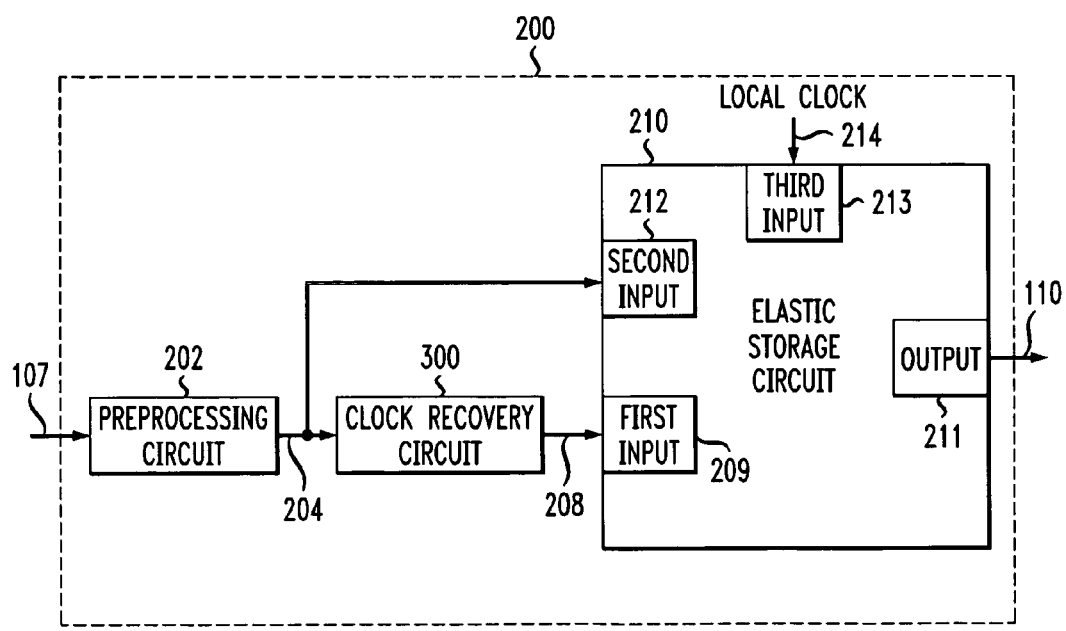
FIG. 2 is a schematic block diagram illustrating the receiver of FIG. 1 in further detail.

FIG. 2 shows the receiver 200 of FIG. 1 in further detail. As shown in FIG. 2, the receiver 200 includes a preprocessing circuit 202 that processes the input data stream 107 to produce a data signal 204. The data signal 204 is input into a clock recovery circuit 300, discussed further below in conjunction with FIG. 3, in accordance with the present invention. The clock recovery circuit 300 uses the data signal 204 to generate a clock signal 208 having a proper phase relationship with the data signal 204. An optional elastic storage circuit 210 can be included for jitter reduction. The elastic storage circuit 210 may be embodied, for example, using the elastic storage circuits, such as (i) a demultiplexer; or (ii) a set of memory storage elements and a set of logic elements interconnected to operate as a first-in-first-out circuit, described in U.S. Pat. No. 5,757,872, entitled "Clock Recovery Circuit," assigned to the assignee of the present invention, and incorporated by reference herein.

The optional elastic storage circuit 210 has a first input 209 that receives the clock signal 208 and has an output 211 that outputs the output data stream 110. The elastic storage circuit 210 has a second input 212 and a third input 213. The second input 212 accepts the data signal 204 representing the input data stream 107. In this embodiment, the data signal 204 is input directly into the second input. As will be apparent to those skilled in the art, flip-flops may be used to provide delay and/or synchronization such that the clock signal 208 and the data signal 204 are in proper relationship. The third input 213 accepts a local clock signal 214.

Figure 3:
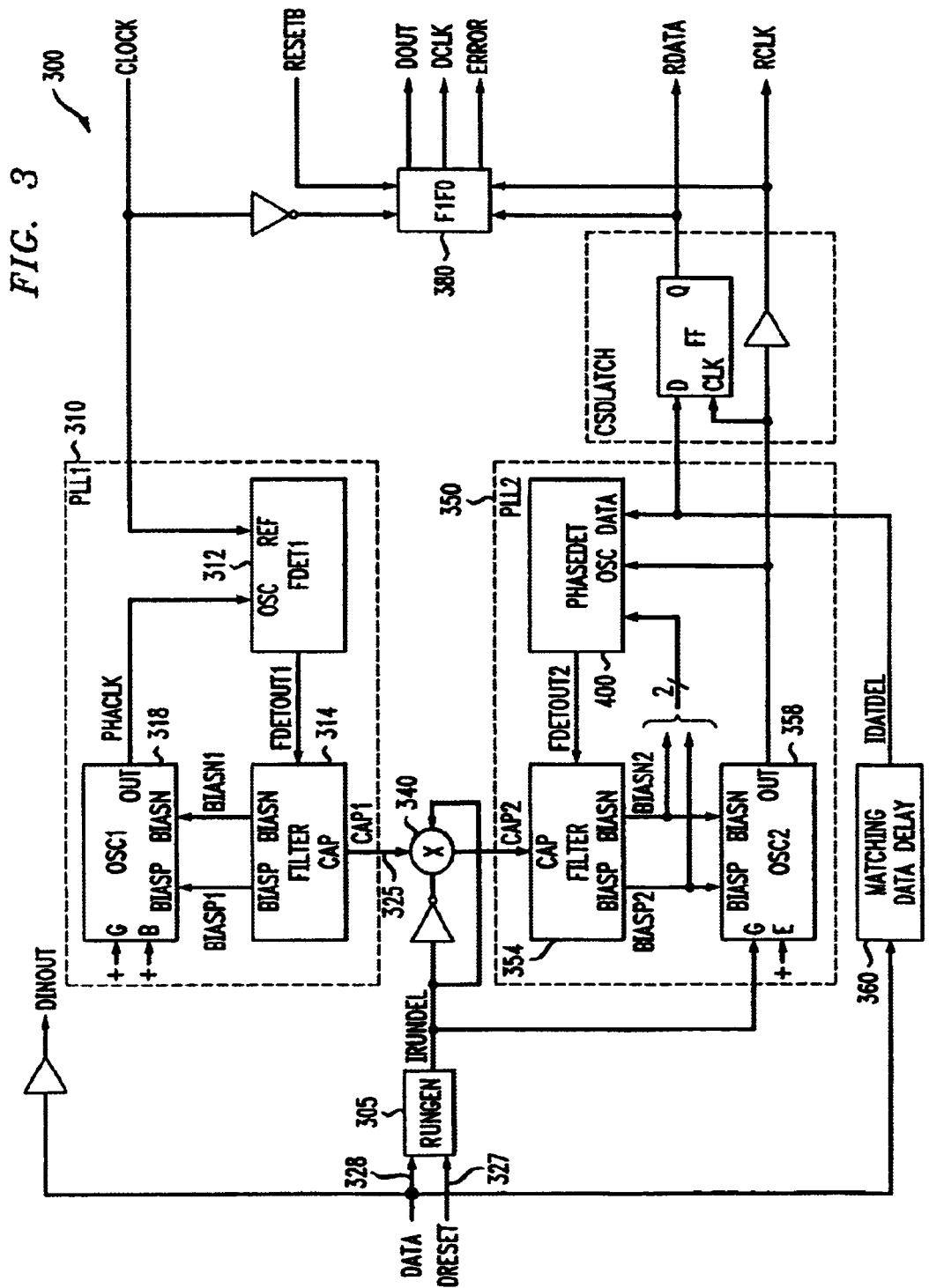
FIG. 3 is a schematic block diagram illustrating the clock recovery circuit of FIG. 2 in further detail, in accordance with the present invention.

FIG. 3 is a schematic block diagram illustrating the clock recovery circuit 300 of FIG. 2 in further detail. As shown in FIG. 3, the clock recovery circuit 300 includes two PLL circuits 310 and 350. According to one feature of the present invention, the clock recovery circuit 300 can generate a clock signal having the same frequency and appropriate phase alignment with the incoming data 328, without requiring any specific transition pattern or strings of binary "1" or "0." As discussed hereinafter, the first PLL 310 initially adjusts to the frequency of the transmitter and indirectly tunes the second PLL 350. In this manner, the second PLL 350 can immediately adjust to the phase of the transmitter, once incoming data is received.

More specifically, the first PLL 310 adjusts to the frequency of the incoming data, and provides a bias voltage, CAP1, to the second PLL 350 to indirectly initially tune the second PLL 350. The bias voltage, CAP1, 325 is applied to the second PLL 350 through a two-position transmission gate (or switch) 340 (short or open) that is initially in a closed (short) position, until a reset signal is received on the DRESET line 327. The transmission gate (or switch) 340 may be embodied as any device that imposes the bias (or current) of the first PLL 310 onto the second PLL 350. In one embodiment, the transmission gate 340 is placed in an open position once data is detected on the DATA line 328. Thus, the first PLL 310 drives the bias voltage, CAP2, of the second PLL 350, to align the frequency with the incoming data, until received data opens the transmission gate 340. Thereafter, the bias voltage, CAP1, is removed and the second PLL 350 can operate without being controlled by PLL1 310. Thereafter, the second PLL 350 oscillates in phase with the received data.

As shown in FIG. 3, the first PLL 310 includes a frequency detector 312, a filter 314 and an oscillator 318, such as a voltage-controlled oscillator. The frequency detector 312 compares the phase of the local reference signal (CLOCK) and the output (PHACLK) of the oscillator 318. It is noted that the local reference signal (CLOCK) operates at the same nominal frequency of the transmitter. Thus, the frequency detector 312 generates an error signal (FDETOUT1) representing the phase difference of the reference signal and the oscillator output. The error signal is filtered by the filter 314 and the bias signals (BIASP1 and BIASN1) serve to adjust the frequency of the oscillator 318 in an upward or downward manner, respectively, and the bias signals (BIASP1 and BIASN1) are integrated over time to correspondingly adjust the phase of the oscillator output. The bias signals (BIASP1 and BIASN1) are applied to the corresponding control inputs of the oscillator to produce an output signal (PHACLK) that tracks the phase of the reference signal. It is noted that while the illustrative embodiment employs two bias signals (BIASP1 and BIASN1), one or more could be employed, as would be apparent to a person of ordinary skill in the art.

Likewise, as shown in FIG. 3, the second PLL 350 includes a phase detector 400, a filter 354 and an oscillator 358, such as a voltage-controlled oscillator (VCO). The phase detector 400 compares the phase of the incoming reference signal (DATA), as appropriately delayed by the matching data delay stage 360, and the output (OSC) of the oscillator 358. It is noted that the matching data delay stage 360 introduces the same delay to the incoming reference signal (DATA) as the delay introduced by the RUNGEN 305, discussed below, and the oscillator 358. The PHASE-DET 400 generates an error signal (FDETOUT2) representing the phase difference of the reference signal IDATDEL and the oscillator output (OSC). The error signal is filtered by the filter 354 and the bias signals (BIASP2 and BIASN2) are applied to the corresponding control inputs of the oscillator to produce an output signal (OSC) that tracks the phase of the reference signal. It is again noted that when the transmission gate 340 is in a closed (short) position, the second PLL 350 is controlled by the bias signal (CAP1) produced by the first PLL 310, VCO 358 is turned off, and FDETOUT2 gives no error signal.

The first PLL 310 should be generally designed with substantially matching characteristics to the second PLL 350. Thus, the oscillators OSC1 and OSC2 318, 358 and the voltage on the capacitors CAP1 and CAP2 in the filters 314 and 354 should be matched. The first-in-first-out (FIFO) 380 is an implementation of the elastic storage circuit 210, discussed above, for jitter reduction. It is noted, however, that the first PLL 310 and the second PLL 350 can be designed with differences in frequency, for example, to allow an offset with a clock signal. For example, the PLLs 310, 350 can be embodied as ring oscillators, each having an odd, but unequal, number of invertors. In such an embodiment, the voltage on the capacitors CAP1 and CAP2 in the filters 314 and 354 can still be matched. For example, if the desired clock operates at 50 MHz, the circuit 300 can operate at 500 MHZ when PLL1 310 has a delay line that is ten times longer than PLL2 350.

RUNGEN 305 is control circuitry that receives DATA 328 and DRESET 327. The output, IRUNDEL, connects the two sides of the transmission gate 340 and stops OSC2 358 upon receiving a DRESET 327. After the DRESET signal 327 goes away, the next received data causes IRUNDEL to open the transmission gate 340 and start OSC2 358 in phase with IDATDEL.

It is to be understood that the embodiments and variations shown and described herein are merely illustrative of the principles of this invention and that various modifications may be implemented by those skilled in the art without departing from the scope and spirit of the invention.

We claim:

1. A clock recovery circuit, comprising:
   a first phase-locked loop (PLL) circuit for generating an oscillator signal having substantially the same frequency as a transmitter clock and for generating a bias signal; and
   a second PLL circuit generating a clock output signal, wherein said second PLL circuit is controlled by said bias signal generated by said first PLL circuit in a first mode and wherein said second PLL circuit has a second mode wherein said second PLL has an initial frequency determined by said bias signal and whereby said second PLL substantially instantaneously adjusts said clock output signal to phase changes of data in an input data stream without utilizing said bias signal.

2. The clock recovery circuit of claim 1, wherein a transition between said first and second modes is controlled by a transmission gate.

3. The clock recovery circuit of claim 1, wherein a transition between said first and second modes is controlled by a switch.

4. The clock recovery circuit of claim 1, wherein a transition between said first and second modes is controlled by a device that selectively imposes a bias current from said first PLL to said second PLL.

5. The clock recovery circuit of claim 1, wherein a transition between said first and second modes is controlled by a device that selectively imposes a bias voltage from said first PLL to said second PLL.

6. The clock recovery circuit of claim 1, wherein said first PLL circuit is tuned to a local clock that operates at substantially the same frequency as a transmitter clock.

7. The clock recovery circuit of claim 1, further comprising an elastic storage circuit for generating a jitter-compensated clock and data output.

8. The clock recovery circuit of claim 1, wherein said second mode is activated upon receipt of incoming data.

9. The clock recovery circuit of claim 1, wherein receipt of incoming data substantially instantaneously starts said second PLL in phase alignment with said received incoming data.

10. The clock recovery circuit of claim 1, wherein said input data stream is a bit packet in asynchronous transfer mode format.

11. The clock recovery circuit of claim 1, wherein said first and second PLLs operate at different frequencies in accordance with one or more predefined ratios.

12. The clock recovery circuit of claim 1, wherein said second PLL circuit generates said clock output signal using transmitted non-predetermined data.

13. A method for recovering a clock signal from an incoming data stream, comprising:

tuning a first phase-locked loop (PLL) circuit to a local clock signal operating at substantially the same frequency as a transmitter clock, wherein said first PLL circuit produces a bias signal;

applying said bias signal to a second PLL circuit in a first mode, said second PLL circuit generating a clock output signal in said first mode having a frequency determined by said bias signal; and removing said bias signal from said second PLL circuit in a second mode, wherein said second PLL circuit has an initial frequency in said second mode determined by said bias signal and whereby said second PLL substantially instantaneously adjusts said clock output signal to phase changes in said incoming data stream in said second mode.

14. The method of claim 13, wherein a transition between said first and second modes is controlled by a transmission gate.

15. The method of claim 13, wherein a transition between said first and second modes is controlled by a switch.

16. The method of claim 13, wherein a transition between said first and second modes is controlled by a device that imposes a bias current from said first PLL to said second PLL.

17. The method of claim 13, wherein a transition between said first and second modes is controlled by a device that imposes a bias voltage from said first PLL to said second PLL.

18. The method of claim 13, wherein said first PLL circuit is tuned to a local clock that operates at substantially the same frequency as a transmitter clock.

19. The method of claim 13, further comprising an elastic storage circuit for generating a jitter-compensated clock and data output.

20. The method of claim 13, wherein said second mode is activated upon receipt of incoming data.

21. The method of claim 13, wherein receipt of incoming data substantially instantaneously starts said second PLL in phase alignment with said received incoming data.

22. The method of claim 13, wherein said input data stream is a bit packet in asynchronous transfer mode format.

23. The clock recovery circuit of claim 13, wherein said first and second PLLs operate at different frequencies in accordance with one or more predefined ratios.

24. The clock recovery circuit of claim 13, wherein said second PLL circuit generates said clock output signal using transmitted non-predetermined data.

25. A clock recovery circuit, comprising:

a first phase-locked loop (PLL) circuit for generating an oscillator signal having substantially the same frequency as a transmitter clock and for generating a bias signal; and a second PLL circuit generating a clock output signal, wherein said second PLL circuit has an initial frequency determined by said bias signal and wherein said second PLL circuit substantially instantaneously adjusts said clock output signal to phase changes of data of an input data stream when said input data stream is present without utilizing said bias signal.

26. A clock recovery circuit, comprising:

first means for generating a first oscillator signal having substantially the same frequency as a transmitter clock;

means for generating a bias signal;

second means for generating a clock output signal having an initial frequency determined by said bias signal and substantially instantaneously adjusting said clock signal output signal to phase changes of data in an input data stream without utilizing said bias signal; and means for selectively imposing said bias signal from said first means to said second means.

27. The clock recovery circuit of claim 26, wherein said means for selectively imposing said bias signal is a transmission gate.

28. The clock recovery circuit of claim 26, wherein said means for selectively imposing said bias signal is a switch.

29. The clock recovery circuit of claim 26, wherein said means for selectively imposing said bias signal is a device that selectively imposes a bias current from said first means to said second means.

30. The clock recovery circuit of claim 26, wherein said means for selectively imposing said bias signal is a device that selectively imposes a bias voltage from said first means to said second means.

31. The clock recovery circuit of claim 26, wherein said means for selectively imposing said bias signal is a multiplexer.

32. The clock recovery circuit of claim 26, further comprising means for generating a jitter-compensated clock and data output.

33. A clock recovery circuit, comprising:

a first phase-locked loop (PLL) circuit for generating an oscillator signal having substantially the same frequency as a transmitter clock and for generating a bias signal;

a second PLL circuit generating a clock output signal in accordance with a control input;

a phase detector for generating an error signal indicating a difference in phase between an incoming reference signal and said clock output signal; and a switch for selecting one of said bias signal and said incoming reference signal to generate said control input.

34. The clock recovery circuit of claim 33, wherein said clock output signal corresponds to phase changes of data of an input data stream in a second mode when said input data stream is present.

35. The clock recovery circuit of claim 33, wherein said multiplexer selects said bias signal in a first mode so that said second PLL has an initial frequency determined by said bias signal.

36. The clock recovery circuit of claim 33, wherein said multiplexer selects said error signal in a second mode so that said second PLL substantially instantaneously adjusts said clock output signal to phase changes of data in an input data stream.

* * * * *